(12) United States Patent
Lee et al.

(10) Patent No.: US 12,498,597 B2
(45) Date of Patent: Dec. 16, 2025

(54) SUBSTRATE TREATING APPARATUS AND METHOD THEREOF

(71) Applicant: SEMES CO., LTD., Chungcheongnam-do (KR)

(72) Inventors: Hong Joo Lee, Chungcheongnam-do (KR); Moo Hyung Yi, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 203 days.

(21) Appl. No.: 18/081,647

(22) Filed: Dec. 14, 2022

(65) Prior Publication Data
US 2023/0191780 A1  Jun. 22, 2023

(30) Foreign Application Priority Data
Dec. 17, 2021 (KR) .................. 10-2021-0181647

(51) Int. Cl.
*G02F 1/13* (2006.01)
*B41J 2/21* (2006.01)
*G02F 1/1335* (2006.01)

(52) U.S. Cl.
CPC .......... *G02F 1/1303* (2013.01); *G02F 1/1335* (2013.01); *G02F 1/133516* (2013.01); *B41J 2/2114* (2013.01)

(58) Field of Classification Search
CPC . G02F 1/1303; G02F 1/1335; G02F 1/133516
See application file for complete search history.

(56) References Cited

U.S. PATENT DOCUMENTS

| 8,318,237 B2 | 11/2012 | Kinoshita |
| 9,987,844 B2 * | 6/2018 | Zhao ............... B41J 2/2125 |
| 2009/0189950 A1 * | 7/2009 | Kojima ............... B41J 3/28 |
| | | 347/40 |

(Continued)

FOREIGN PATENT DOCUMENTS

| CN | 104985933 | 10/2015 |
| CN | 108944045 | 12/2018 |

(Continued)

OTHER PUBLICATIONS

Office Action dated Nov. 20, 2023 for Korean Patent Application No. 10-2021-0181647 and its English translation from Global Dossier.

(Continued)

*Primary Examiner* — Kelly M Gambetta
(74) *Attorney, Agent, or Firm* — WOMBLE DICKINSON (US) LLP

(57) ABSTRACT

The present disclosure provides substrate processing apparatus and a substrate processing method for composing nozzles having different drop sizes into one or more pack units and performing pixel printing by using nozzles belonging to the thus composed packs. The substrate processing method includes extracting nozzles that have different drop sizes as different sized dropping nozzles, composing extracted nozzles into one or more packs, and performing pixel printing on the substrate with nozzles included in the pack by discharging a substrate treatment solution to a common target location on the substrate.

13 Claims, 14 Drawing Sheets

(56) References Cited

U.S. PATENT DOCUMENTS

2013/0036972 A1    2/2013  Kinoshita

FOREIGN PATENT DOCUMENTS

| | | |
|---|---|---|
| JP | 2006-159703 | 6/2006 |
| JP | 2008-119593 | 5/2008 |
| JP | 2008-268558 | 11/2008 |
| JP | 2009-28675 | 2/2009 |
| JP | 2009-69837 | 4/2009 |
| JP | 2009069837 A * | 4/2009 |
| KR | 10-2005-0010246 | 1/2005 |
| KR | 10-2008-0054344 | 6/2008 |
| KR | 10-2010-0115219 | 10/2010 |
| KR | 10-1302425 | 9/2013 |
| KR | 101561785 B1 * | 10/2015 |

OTHER PUBLICATIONS

Office Action (1st) dated Feb. 14, 2025 for Chinese Patent Application No. 202211645424.4 and its English translation provided by Applicant's foreign counsel/Google Translate.

Notice of Allowance dated Oct. 30, 2024 for Korean Patent Application No. 10-2021-0181647 and its English translation from Global Dossier.

* cited by examiner

FIG. 11

| 6pl | | |
|---|---|---|
| Drop | Volumn | Note |
| 14 | 84 | |
| 15 | 90 | |
| 16 | 96 | ① Error 4% |
| 17 | 102 | ② Error 2% |
| 18 | 108 | |

FIG. 12

| 6pl | | | 13pl | | |
|---|---|---|---|---|---|
| Drop | Volumn | Note | Drop | Volumn | Note |
| 1 | 6 |  | 1 | 13 |  |
| 2 | 12 |  | 2 | 26 |  |
| 3 | 18 |  | 3 | 39 |  |
| 4 | 24 |  | 4 | 52 | ① |
| 5 | 30 |  | 5 | 65 |  |
| 6 | 36 |  | 6 | 78 |  |
| 7 | 42 |  | 7 | 91 |  |
| 8 | 48 | ② | 8 | 104 |  |
| 9 | 54 |  | 9 | 117 |  |
| 10 | 60 |  | 10 | 130 |  |

FIG. 13

| 6pl | | |
|---|---|---|
| Drop | Volumn | Note |
| 30 | 180 | |
| 31 | 186 | |
| 32 | 192 | ① 0.89% Error |
| 33 | 198 | |
| 34 | 204 | |

FIG. 14

| 6pl | | | 13pl | | |
|---|---|---|---|---|---|
| Drop | Volumn | Note | Drop | Volumn | Note |
| 8 | 48 | | 8 | 104 | |
| 9 | 54 | | 9 | 117 | |
| 10 | 60 | ② | 10 | 130 | ① |
| 11 | 66 | | 11 | 143 | |
| 12 | 72 | | 12 | 156 | |
| 13 | 78 | | 13 | 169 | |
| 14 | 84 | | 14 | 182 | |

SUBSTRATE TREATING APPARATUS AND METHOD THEREOF

CROSS-REFERENCE TO RELATED APPLICATION

This application claims priority from Korean Patent Application No. 10-2021-0181647 filed on Dec. 17, 2021 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a substrate treating or processing apparatus and a method thereof. More particularly, the present disclosure relates to a substrate processing apparatus used for manufacturing display devices and a method thereof.

2. Description of the Related Art

When performing a printing process, e.g., RGB patterning on a transparent substrate, printing equipment having an inkjet head unit can be used to manufacture a display device such as an LCD panel, PDP panel, LED panel, etc.

SUMMARY

Multiple nozzles installed in the inkjet head unit are used to discharge droplets on a substrate to perform pixel printing on the substrate. In this case, composing those nozzles having an equal drop size as a single pack and utilizing the nozzles that belong to one of the multiple nozzle packs in discharging droplets on the substrate can render the pixel printing to provide pixels each with a volume of a predetermined size.

However, such use of a single pack composed of nozzles of an equal drop size would cause an error to occur in making a pixel have a volume of a predetermined size while utilizing nozzles having a small drop size takes cumbersome multiple scan operations to be performed.

Aspects of the present disclosure provide a substrate processing apparatus and a substrate processing method for composing multiple nozzles having different drop sizes into unit packs and performing pixel printing by using nozzles belonging to the thus composed pack of nozzles.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, there is provided a method of treating a substrate, including extracting nozzles that have different drop sizes as different sized dropping nozzles, composing extracted nozzles into one or more packs, and performing pixel printing on the substrate with nozzles included in the pack by discharging a substrate treatment solution to a common target location on the substrate The extracting of the nozzles may include extracting at least one or more of the different sized dropping nozzles each by taking account of a pixel volume.

The extracting of the nozzles may include selecting a plurality of drop sizes and then extracting the nozzles that are related to respective drop sizes, or determining a selected number of nozzles and then extracting the different sized dropping nozzles based on the selected number.

The extracting of the nozzles may include extracting the different sized dropping nozzles from a single head or extracting the different sized dropping nozzles from a plurality of heads.

The extracting of the different sized dropping nozzles may be performed with the single head including the different sized dropping nozzles.

The extracting of the different sized dropping nozzles from a plurality of heads may be performed with a plurality of equal sized dropping nozzles included in each of the heads and with different sized dropping nozzles included in different ones of the heads.

The substrate treating method may further include, before the extracting of the different sized dropping nozzles, obtaining information on grooves that are formed on the substrate, and determining a volume of a pixel formed in each of the grooves based on the information on the grooves.

The obtaining of information on the grooves may include obtaining information on the grooves based on an image obtained by photographing the substrate.

The information on the grooves may include the diameter of each groove and the depth of each groove.

The extracting of the nozzles may include analyzing drop sizes of the nozzles that are included in an inkjet head and extracting the different sized dropping nozzles based on a result of the analyzing of the drop sizes.

The substrate treating method may further include, before the extracting of the different sized dropping nozzles, in particular, between the determining of the volume of the pixel and the extracting of the different sized dropping nozzles, determining whether the substrate treatment solution is available or unavailable to be discharged by an amount corresponding to a pixel volume.

The extracting of the nozzles may include, upon determining that the substrate treatment solution is unavailable to be discharged by the amount corresponding to the pixel volume, extracting the different sized dropping nozzles to exceed the pixel volume while maintaining minimum differences from the pixel volume.

The obtaining of information on the grooves is performed when individually forming cell regions for manufacturing display devices having different sizes and includes obtaining information on the grooves in relation to each of the cell regions.

According to another aspect of the present disclosure, there is provided a method of treating a substrate, including obtaining information on grooves formed on the substrate, determining a pixel volume of a pixel formed in each of the grooves based on the information on the grooves, extracting nozzles that have different drop sizes as different sized dropping nozzles each by taking account of the pixel volume, composing extracted nozzles into one or more packs, and performing pixel printing on the substrate with the nozzles included in the pack by discharging a substrate treatment solution to a common target location on the substrate. Here, the extracting of the nozzles includes analyzing drop sizes of the nozzles that are included in an inkjet head and extracting the different sized dropping nozzles based on a result of the analyzing of the drop sizes. The substrate treating method further includes determining whether the substrate treatment solution is available or unavailable to be discharged by an amount corresponding to a pixel volume, and upon determining that the substrate treatment solution is unavailable to be discharged by the amount corresponding to the pixel volume, extracting the different sized dropping nozzles to exceed the pixel volume while maintaining minimum differences from the pixel volume.

According to yet another aspect of the present disclosure, there is provided an apparatus for treating a substrate, including a processing unit, an inkjet head unit, a gantry unit, and a controller. The processing unit is configured to support the substrate while the substrate is being processed. The inkjet head unit includes a plurality of nozzles and is configured to discharge a substrate treatment solution onto the substrate through the nozzles. The gantry unit is configured to move the inkjet head unit over the substrate. The controller is configured to control operations of the nozzles, to extract the nozzles that have different drop sizes as different sized dropping nozzles and compose extracted nozzles into one or more packs, and to perform pixel printing on the substrate with the nozzles included in the pack by discharging the substrate treatment solution to a common target location on the substrate.

BRIEF DESCRIPTION OF THE DRAWINGS

The above and other aspects and features of the present disclosure will become more apparent by describing in detail exemplary embodiments thereof with reference to the attached drawings, in which:

FIG. 11 is a diagram illustrating a first example case of matching a target volume of 100 pl.

FIG. 12 is a diagram illustrating a second example case of matching a target volume of 100 pl.

FIG. 13 is a diagram illustrating a first example case of matching a target volume of 190.3 pl.

FIG. 14 is a diagram illustrating a second example case of matching a target volume of 190.3 pl.

DETAILED DESCRIPTION OF THE EMBODIMENTS

Figure 1:
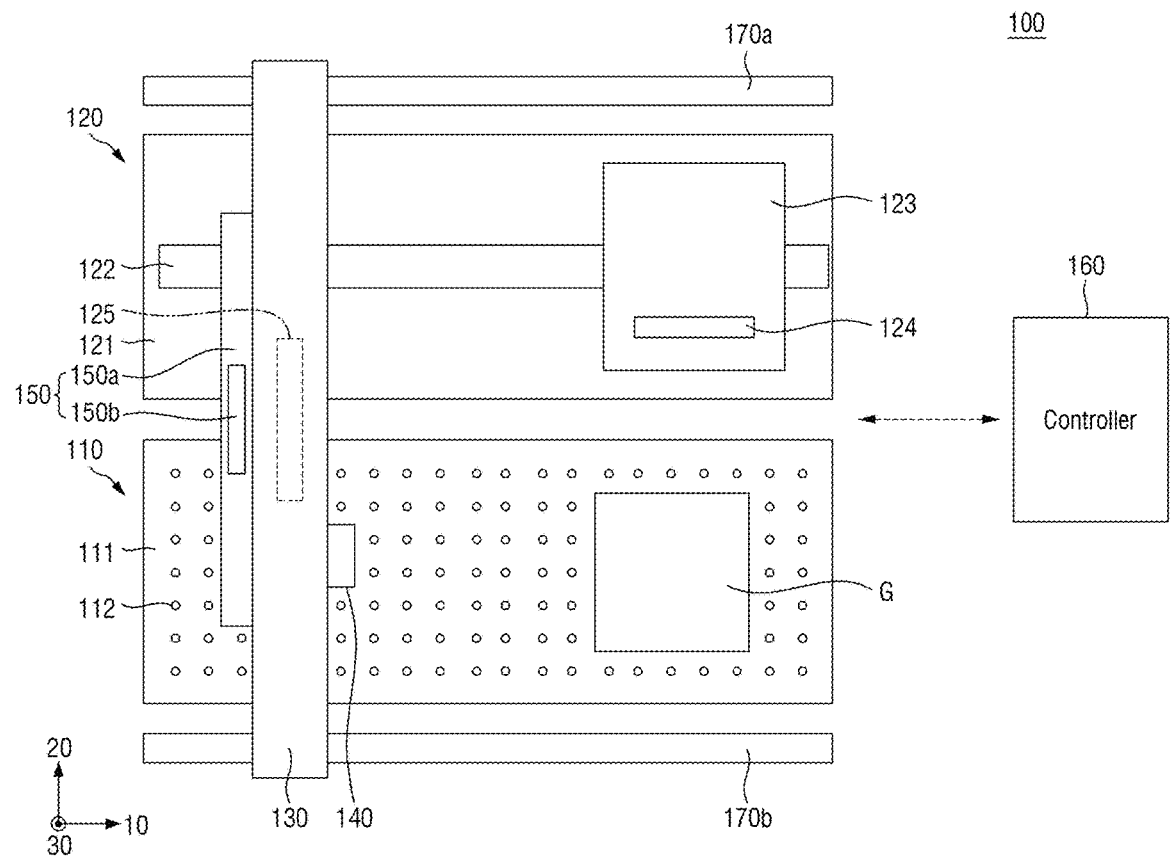
FIG. 1 is a conceptual schematic diagram illustrating a structure of a substrate processing apparatus according to at least one embodiment of the present disclosure.

Advantages and features of the present disclosure and methods of accomplishing the same may be understood more readily by reference to the following detailed description of exemplary embodiments and the accompanying drawings. The present disclosure may, however, be embodied in many different forms and should not be construed as being limited to the embodiments set forth herein. Rather, these embodiments are provided so that this disclosure will be thorough and complete and will fully convey the concept of the disclosure to those skilled in the art, and the present disclosure will only be defined by the appended claims. Like reference numerals refer to like elements throughout the specification.

It will also be understood that when an element or a layer is referred to as being "on" another element or layer, it can be not only directly on the other element or layer, but also indirectly thereon with intervening elements or layers being present. In contrast, when an element is referred to as being "directly on" another element, there are no intervening elements present.

Spatially relative terms, such as "below," "beneath," "lower," "above," "upper," and the like, may be used herein for ease of description to convey one element's or feature's relationship to another element(s) or feature(s) as illustrated in the drawings. It will be understood that the spatially relative terms are intended to encompass different orientations of the device in use or operation in addition to the orientation depicted in the drawings. For example, when a device in the drawings is turned over, elements described as "below" or "beneath" other elements or features would then be oriented "above" the other elements or features. Thus, the illustrative term "below" can encompass both an orientation of above and below. The device may be otherwise oriented (rotated 90 degrees or at other orientations), and the spatially relative descriptors used herein may be interpreted accordingly.

It will be understood that, although the terms first, second, etc. may be used herein to describe various elements, components, and/or sections, these elements, components, and/or sections should not be limited by these terms. These terms are only used to distinguish one element, component, or section from another element, component, or section. Thus, a first element, first component, or first section discussed below could be termed a second element, second component, or second section without departing from the teachings of the present disclosure.

The terminology used herein is for the purpose of describing particular embodiments only and is not intended to be limiting of the present disclosure. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, some embodiments of the present disclosure will be described in detail with reference to the accompanying drawings. In the following description, like reference numerals designate like elements, although the elements are shown in different drawings. Further, in the following description of some embodiments, a detailed description of related known components and functions when considered to obscure the subject of the present disclosure will be omitted for the purpose of clarity and for brevity.

The present disclosure relates to a controller for composing multiple nozzles having different drop sizes into unit packs and performing pixel printing by using nozzles belonging to the thus composed pack of nozzles, and a substrate processing apparatus having the same controller. According to the present disclosure, a single scan operation using a pack can provide a pixel with a volume of a predetermined size, thereby improving the productivity of the product. Hereinafter, the present disclosure will be described in detail with reference to drawings and others.

FIG. 1 is a conceptual schematic diagram illustrating a structure of a substrate processing apparatus 100 according to at least one embodiment of the present disclosure.

The substrate processing apparatus 100 processes a substrate G (as in glass for example) used for manufacturing a display device. The substrate processing apparatus 100 may be implemented as an inkjet facility for jetting or discharging the substrate treatment solution onto the substrate G by using an inkjet head unit 140, and in particular, it may be implemented as a circulatory inkjet facility to prevent clogging of nozzles by the substrate treatment solution. The substrate processing apparatus 100 may be provided as, for example, a quantum dot (QD) color filter (CF) inkjet facility.

Referring to FIG. 1, the substrate processing apparatus 100 may be configured to include a processing unit 110, a maintenance unit 120, a gantry unit 130, the inkjet head unit 140, a substrate-treatment-solution supply unit 150, and a controller 160.

The processing unit 110 supports the substrate G while a PT operation is performed on the substrate G, meaning a PrinTing processing of the substrate G is performed with the substrate treatment solution. The processing unit 110 may support the substrate G by using a non-contact method. The processing unit 110 may support the substrate G by levitating the substrate G in the air by using, for example, air. However, embodiments of the present disclosure are not limited thereto. The processing unit 110 may also support the substrate G by using a contact method. The processing unit 110 may support the substrate G by using, for example, a support member having a top seating surface.

The substrate treatment solution refers to a chemical solution used to print on the substrate G. The substrate treatment solution may be, for example, QD ink including ultrafine semiconductor particles.

The processing unit 110 when supporting the substrate G with air, may be configured to include a first stage 111 and air holes 112.

The first stage 111 is provided as a base for allowing the substrate G to be seated thereon. The air holes 112 may be formed through the upper surface of the first stage 111 and may be formed in the PT zone on the first stage 111.

The air holes 112 may inject air in an upper direction (a third direction 30) of the first stage 111. This enables the air holes 112 to levitate the substrate G seated on the first stage 111.

Meanwhile, although not shown in FIG. 1, the processing unit 110 may further include a gripper. The gripper is for preventing the substrate G from being separated from the first stage 111 when the substrate G moves along the longitudinal direction (a first direction 10) of the first stage 111. The gripper may grip the substrate G to prevent it from being separated from the first stage 111 and may slide along a guide rail (not shown) while holding the substrate G as the latter moves.

The maintenance unit 120 is adapted to measure a discharge position (i.e., a plotting spot) of the substrate treatment solution on the substrate G, discharging or non-discharging of the substrate treatment solution, and the like. The maintenance unit 120 may measure, for each of the plurality of nozzles provided in the inkjet head unit 140, the discharge position of the substrate treatment solution, discharging or non-discharging of the substrate treatment solution, and it may render the thus obtained measurement result to be provided to the controller 160.

The maintenance unit 120 may be configured to include, for example, a second stage 121, a third guide rail 122, a first plate 123, a calibration board 124, and a vision module 125.

As with the first stage 111, the second stage 121 serves as a base and may be arranged in parallel with the first stage 111. The second stage 121 may be provided to have the same size as the first stage 111, but may be provided to have a size smaller or larger than that of the first stage 111. The second stage 121 may include an MT zone thereon.

The third guide rail 122 is to guide the travel of the first plate 123. The third guide rail 122 may be provided on the second stage 121 in at least one line along the longitudinal direction (first direction 10) of the second stage 121. The third guide rail 122 may be implemented as, for example, a linear motor guide system (LM guide system).

Although not shown in FIG. 1, the maintenance unit 120 may further include a fourth guide rail. As with the third guide rail 122, the fourth guide rail guides the travel of the first plate 123, and may be provided on the second stage 121 in at least one line along the width direction (a second direction 20) thereof. The fourth guide rail may also be implemented as an LM guide system, like the third guide rail 122.

The first plate 123 is adapted to move on the second stage 121 along the third guide rail 122 and/or the fourth guide rail. The first plate 123 may move in parallel with the substrate G along the third guide rail 122 and may approach or move away from the substrate G along the fourth guide rail.

The calibration board 124 is for measuring the discharge position of the substrate treatment solution on the substrate G. The calibration board 124 may be installed on the first plate 123, including an alignment mark, a ruler, and the like, and it may be provided in the longitudinal direction (first direction 10) of the first plate 123.

The vision module 125 obtains image information on the substrate G to measure the discharge position of the substrate treatment solution, discharging or non-discharging of the substrate treatment solution and the like. The vision module 125 may include an area scan camera, a line scan camera, and the like, and may obtain image information on the substrate G in real time. Meanwhile, the vision module 125 may obtain and provide information on the calibration board 124 as well as information on the substrate G on which the substrate treatment solution has been discharged.

The vision module 125 may be provided on the lateral side or the lower side of the gantry unit 130 to photograph the substrate G or the like. The vision module 125 may be installed, for example, to be attached to a side surface of the inkjet head unit 140. However, the embodiments of the present disclosure are not limited thereto. The vision module 125 may be provided on the first plate 123. Meanwhile, multiples of the vision module 125 may be provided in the substrate processing apparatus 100 and may be fixedly installed or movably installed.

The gantry unit 130 supports the inkjet head unit 140. The gantry unit 130 may be provided on the first stage 111 and the second stage 121 for allowing the inkjet head unit 140 to discharge the substrate treatment solution onto the substrate G.

The gantry unit 130 may be installed over the first stage 111 and the second stage 121 to be elongated in the width direction (second direction 20) of the first stage 111 and the second stage 121. The gantry unit 130 may move in the longitudinal direction (first direction 10) of the first stage 111 and the second stage 121 along the first guide rail 170*a* and the second guide rail 170*b*. Meanwhile, the first guide rail 170*a* and the second guide rail 170*b* may be provided externally of the first stage 111 and the second stage 121 to extend along the longitudinal direction (first direction 10) of the first stage 111 and the second stage 121.

Although not shown in FIG. 1, the substrate processing apparatus 100 may further include a gantry transport unit. The gantry transport unit moves the gantry unit 130 along the first guide rail 170*a* and the second guide rail 170*b*. The gantry transport unit may be installed inside the gantry unit 130 and may include a first transport module and a second transport module (both not shown). The first transport module and the second transport module may be provided at both ends within the gantry unit 130, and may slidably move the gantry unit 130 along the first guide rail 170*a* and the second guide rail 170*b*.

The inkjet head unit 140 discharges the substrate treatment solution in the form of droplets on the substrate G. The inkjet head unit 140 may be provided on the side or below the gantry unit 130.

At least one inkjet head unit 140 may be installed in the gantry unit 130. When a plurality of inkjet head units 140 are installed in the gantry unit 130, the inkjet head units 140 may be arranged in a line along the longitudinal direction (second direction 20) of the gantry unit 130.

To be at a desired point on the substrate G, the inkjet head unit 140 may move along the longitudinal direction (second direction 20) of the gantry unit 130. However, the embodiments of the present disclosure are not limited thereto. The inkjet head unit 140 may move along the height direction (third direction 30) of the gantry unit 130, and may also rotate clockwise or counterclockwise.

Meanwhile, the inkjet head unit 140 may be fixedly installed to the gantry unit 130. In this case, the gantry unit 130 may be provided to be movable therefor.

Meanwhile, although not shown in FIG. 1, the substrate processing apparatus 100 may further include an inkjet head transport unit. The inkjet head transport unit linearly moves or rotates the inkjet head unit 140. When the substrate processing apparatus 100 is configured to include a plurality of inkjet head units 140, the inkjet head transport unit may be provided in the substrate processing apparatus 100 as many as the number of inkjet head units 140 to independently operate the latter. On the other hand, a single inkjet head transport unit may be provided in the substrate processing apparatus 100 to uniformly operate the multiple inkjet head units 140.

Although not shown in FIG. 1, the inkjet head unit 140 may include a nozzle plate, a plurality of nozzles, a piezoelectric element, and the like. The nozzle plate constitutes the body of the inkjet head unit 140. A plurality of (e.g., as many as 128, 256, etc.) nozzles may be provided in multiple rows and columns at regular intervals under the nozzle plate, and the piezoelectric element may be provided in the nozzle plate as many as the number of nozzles. With the inkjet head unit 140 configured as described above, the substrate treatment solution may be discharged onto the substrate G through the nozzles in response to the operation of the piezoelectric elements.

Meanwhile, the inkjet head units 140 may independently control the discharge amounts of the substrate treatment solution provided through the respective nozzles according to the voltage applied to the piezoelectric elements.

The substrate-treatment-solution supply unit 150 supplies the substrate-treatment ink to the inkjet head unit 140. The substrate-treatment-solution supply unit 150 may include a storage tank 150*a* and a pressure control module 150*b*.

The storage tank 150*a* is for storing the substrate treatment solution, and the pressure control module 150*b* is for adjusting the internal pressure of the storage tank 150*a*. The storage tank 150*a* may supply an appropriate amount of the substrate treatment solution to the inkjet head unit(s) 140 based on the pressure provided by the pressure control module 150*b*.

The controller 160 is adapted to cause maintenance to be performed on the inkjet head unit 140. The controller 160 operates based on the measurement result of the maintenance unit 120 to correct the discharge position of the substrate treatment solution from each of the nozzles provided in the inkjet head unit 140 or to detect a defective nozzle that discharges no substrate-treatment solution to cause a cleaning work to be performed on defective nozzles. To this end, the controller 160 may control the operation of each of the components constituting the substrate processing apparatus 100.

The controller 160 may be implemented by a computer or a server, including a process controller, a control program, an input module, an output module (or a display module), a memory module, and the like. Here, the process controller may include a microprocessor that executes a control function for each of the components constituting the substrate processing apparatus 100, and the control program may execute various processes of the substrate processing apparatus 100 under the control of the process controller. The memory module stores programs, i.e., processing recipes for executing various processes of the substrate processing apparatus 100 according to various data and processing conditions.

The present disclosure, as described above, composes a plurality of nozzles having different drop sizes into unit packs and performs the pixel printing on the substrate by using the nozzles belonging to the composed unit pack. The following describes such a method in detail.

The above method may be performed by the controller 160 constituting the substrate processing apparatus 100. However, the embodiments of the present disclosure are not limited thereto. To perform this method, a control device (e.g., a computer) provided separately from the controller 160 may be included in the substrate processing apparatus 100. The following illustrates an example case in which the above method is performed by the controller 160 constituting the substrate processing apparatus 100.

If the multiple nozzles having the same drop size are composed as a unit pack, difficulty arises when using the nozzles constituting the pack to make a pixel have a volume of a predetermined size.

For example, assuming to liquid fill a volume of 100 pl in one 300 µm-sized pixel, fifteen 20 µm-sized nozzles may be composed as one pack and participate in printing the pixel.

In the above case, if each nozzle could fill a volume of 6 pl with one drop, 15 nozzles would fill a volume of 90 pl at 1-swath and 1-drop. Therefore, filling the 100 pl volume takes a lot of work of performing a print job at 1-swath and 2-drop or more or a print job at 2-swath or more.

Additionally, if each nozzle could fill the volume of 7 pl with one drop, 15 nozzles would fill the volume of 105 pl at 1-swath and 1-drop, resulting in an overflow by 5 pl.

In the case of pixel printing as in the above, when performing printing by mixing available nozzles as much as the length of the pixel to provide the pixel with a volume of a predetermined size, one needs to repeat the 1-scan (2-swath) action inconveniently until the desired volume can be filled, while confronting the difficulty of discharging the droplets on the substrate to meet a predetermined volume.

The present disclosure resolves this issue by composing nozzles that have different drop sizes, i.e., different sized dropping nozzles into a single pack, and performing pixel printing to provide the pixel with a volume of a predetermined size by using the nozzles belonging to the thus composed nozzle pack.

For example, it is assumed that a volume of 100 pl is liquid filled in one pixel having a size of 300 µm as described above. In this case, 15 nozzles with a size of 20 µm may be composed as one pack and participate in printing the pixel.

The above case composes 10 nozzles that could liquid fill the volume of 7 µl and 5 nozzles that can fill the volume of 6 pl into one pack, thereby allowing 15 nozzles at 1-swath and 1-drop to accurately fill a volume of 100 pl. This eliminates the inconvenience of having to repeat 1-scan action to print a pixel to have a volume of a predetermined size and provides the effect of improving productivity by printing a pixel quickly to have a volume of a predetermined size.

The controller 160 may compose the different sized dropping nozzles into one pack to print the pixel to have a volume of a predetermined size. The controller 160 may compose one pack by including at least one each of two types of nozzles having different drop sizes.

However, the embodiments of the present disclosure are not limited thereto. The controller 160 may also include at least one or more of three or more types of nozzles having different drop sizes to form one pack.

Figure 2:
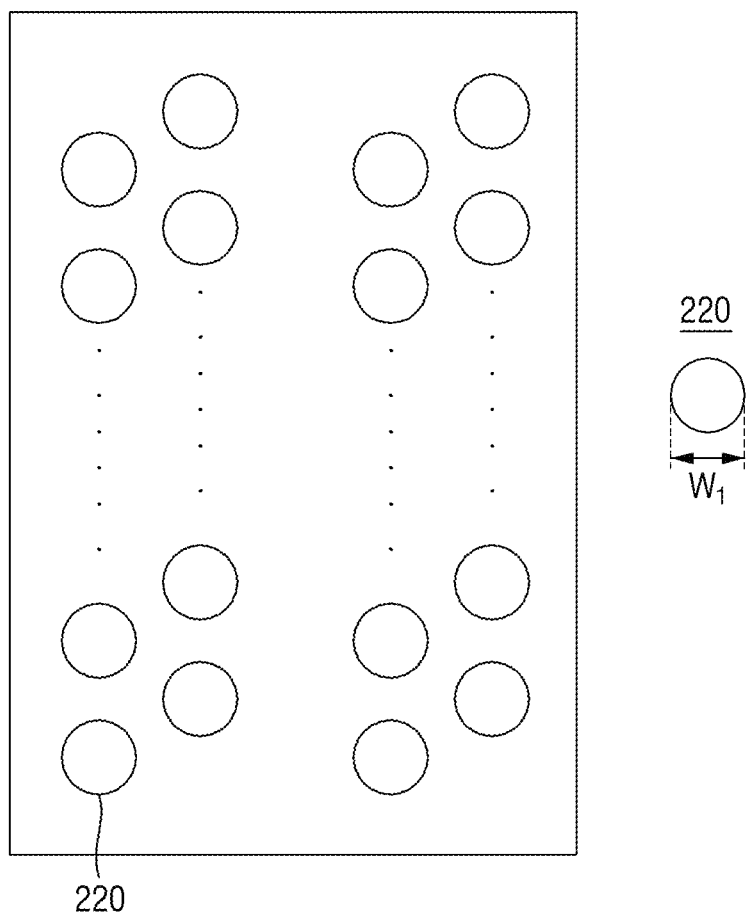
FIG. 2 is a diagram illustrating the first example nozzles constituting an inkjet head according to at least one embodiment of the present disclosure.

As shown in FIG. 2, one inkjet head 210 may be installed with a plurality of nozzles 220 for discharging droplets of the same volume w1 onto the substrate. FIG. 2 is a diagram illustrating the first example nozzles 220 constituting the inkjet head 210 according to at least one embodiment of the present disclosure.

Figure 3:
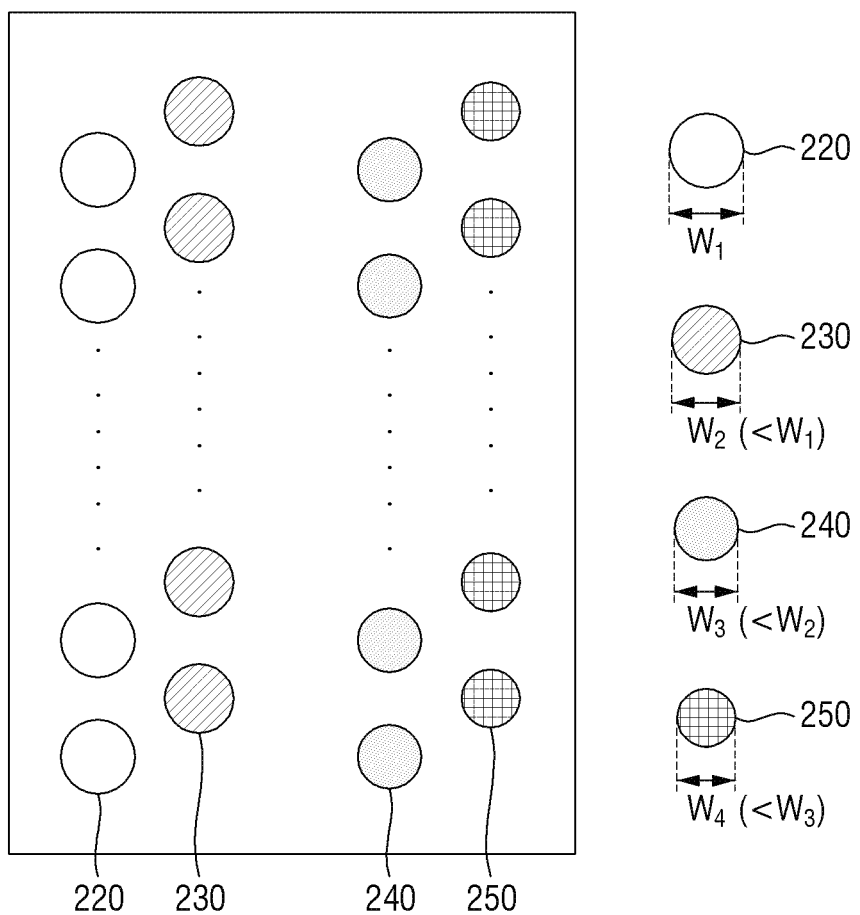
FIG. 3 is a diagram illustrating the second example nozzles constituting an inkjet head according to at least one embodiment of the present disclosure.

However, the embodiments of the present disclosure are not limited thereto. As shown in FIG. 3, one inkjet head 210 may be installed with a plurality of nozzles 220, 230, 240, 250 for discharging droplets of different volumes w1, w2, w3, and w4 on the substrate. FIG. 3 is a diagram illustrating the second example nozzles 220, 230, 240, 250 constituting the inkjet head 210 according to at least one embodiment of the present disclosure.

Here, an example case will be described where one inkjet head 210 is installed with the plurality of nozzles 220, 230, 240, 250 for discharging droplets of different volumes w1, w2, w3, and w4 on the substrate.

Figure 4:
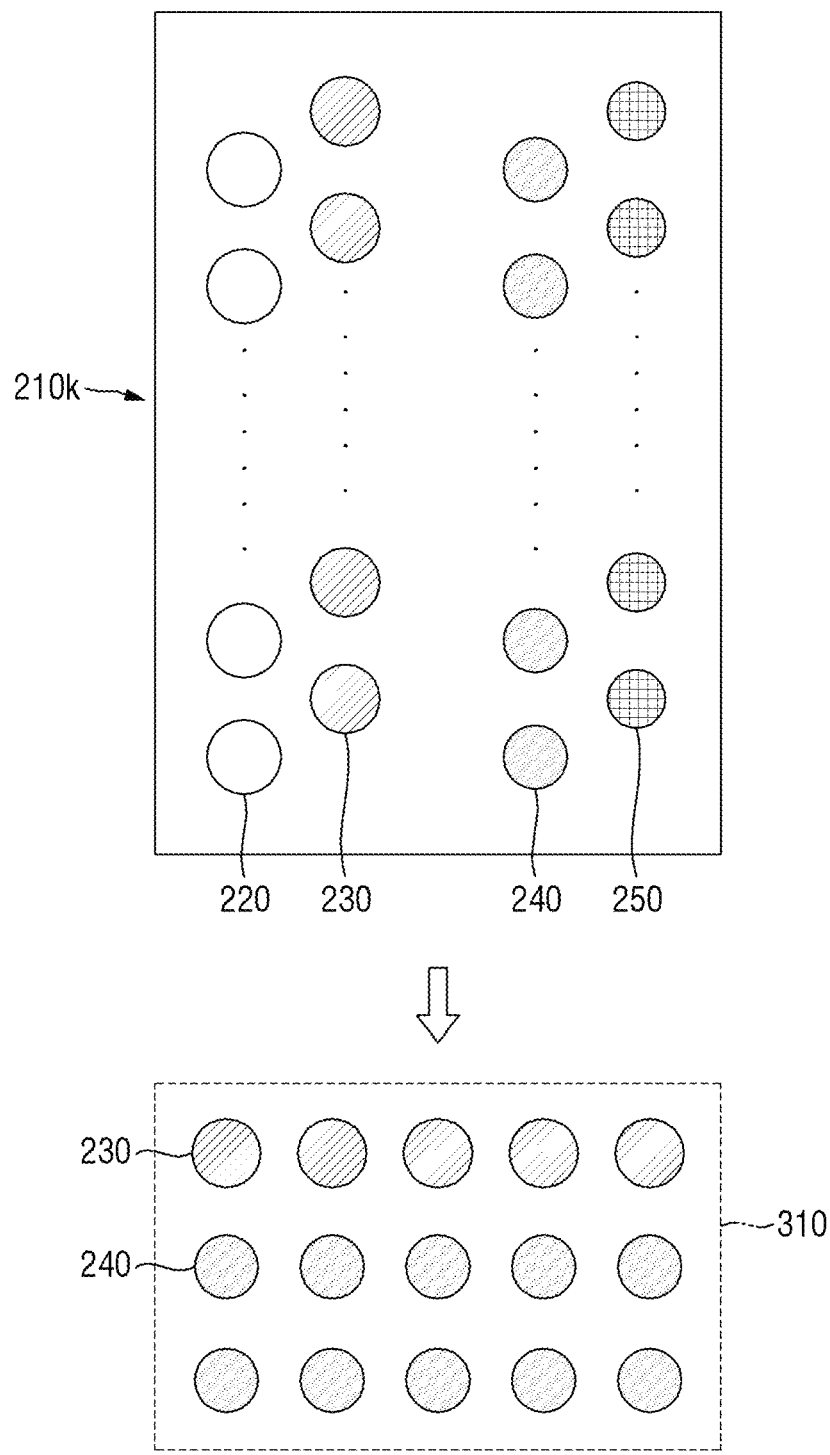
FIG. 4 is a diagram illustrating a first example method of composing a pack by mixing nozzles by drop size.

First, with reference to FIG. 4, the former of the two cases will be described, wherein one pack is composed by including at least one each of two types of nozzles having different drop sizes.

Of the multiple inkjet heads 210a, 210b, . . . , 210k, . . . , 210n, there is a k-th inkjet head 210k that may be installed with multiples of each of the first nozzle 220 for discharging droplets corresponding to a volume of 4 pl onto the substrate, the second nozzle 230 for discharging droplets corresponding to a volume of 6 pl onto the substrate, the third nozzle 240 for discharging droplets corresponding to a volume of 7 pl onto the substrate, the fourth nozzle 250 for discharging droplets corresponding to a volume of 9 pl onto the substrate, etc.

In this case, the controller 160 may compose a first pack 310 with five second nozzles 230 and ten third nozzles 240, and utilize the second nozzles 230 and the third nozzles 240 constituting the first pack 310 to perform pixel printing for providing a pixel with a volume of 100 pl at one drop. FIG. 4 is a diagram illustrating the first example method of composing a pack by mixing nozzles by drop size.

Figure 5:
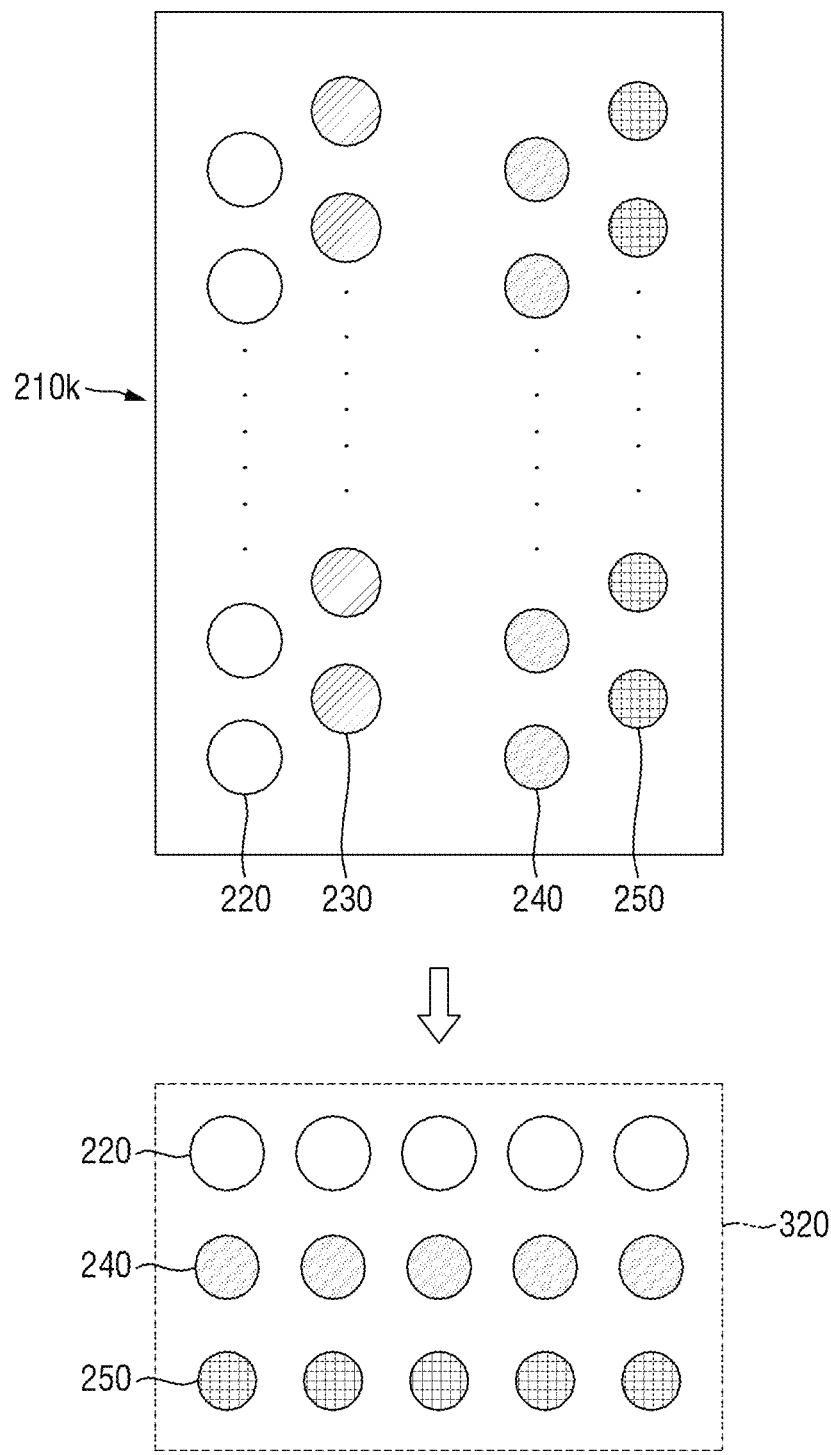
FIG. 5 is a diagram illustrating a second example method of composing a pack by mixing nozzles by drop size.

The following, with reference to FIG. 5, describes the latter case where one pack is composed by including at least one each of three types of nozzles having different drop sizes.

In this case, the controller 160 may compose five first nozzles 220, five third nozzles 240, and five fourth nozzles 250 into a second pack 320 and utilize the first nozzles 220, third nozzles 240, and fourth nozzles 250 constituting the second pack 320 to perform pixel printing to provide a pixel with a volume of 100 pl at one drop. FIG. 5 is a diagram illustrating the second example method of composing a pack by mixing nozzles by drop size.

Meanwhile, as described above, each single inkjet head 210 may be installed exclusively with nozzles for discharging droplets of the same volume onto a substrate. Hereinafter, this case will be described.

Figure 6:
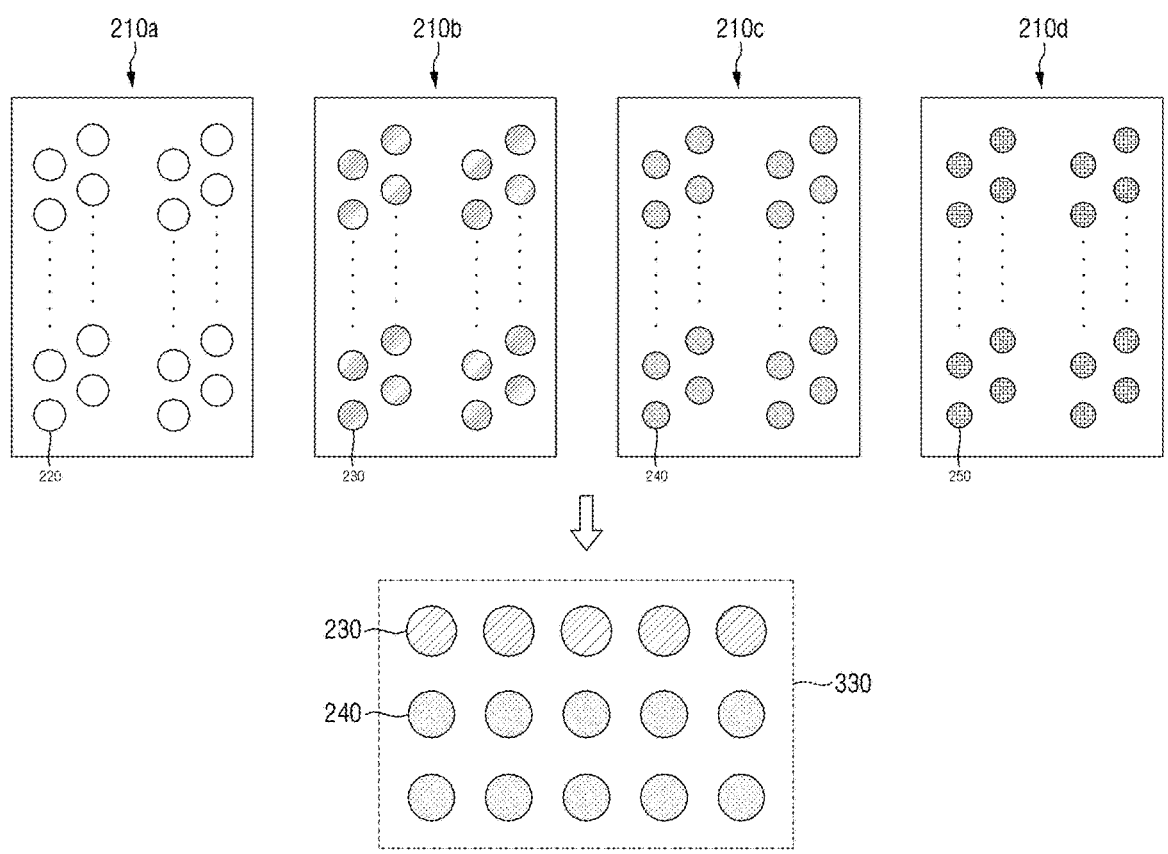
FIG. 6 is a diagram illustrating a third example method of composing a pack by mixing nozzles by drop size.

First, with reference to FIG. 6, the former of the two cases will be described, wherein one pack is composed by including at least one each of two types of nozzles having different drop sizes.

Of the multiple inkjet heads 210a, 210b, . . . , 210k, . . . , 210n, the first inkjet head 210a may be installed with multiple first nozzles 220 each discharging droplets corresponding to a volume of 4 pl onto the substrate. Further, the second inkjet head 210b may be installed with multiple second nozzles 230 each discharging droplets corresponding to a volume of 6 pl onto the substrate, and the third inkjet head 210c may be installed with multiple third nozzles 240 each discharging droplets corresponding to a volume of 7 pl onto the substrate. Additionally, the fourth inkjet head 210d may be installed with multiple fourth nozzles 250 for each discharging droplets corresponding to a volume of 9 pl onto the substrate.

In this case, the controller 160 may extract five second nozzles 230 from the second inkjet head 210b and extract ten third nozzles 240 from the third inkjet head 210c and thereby compose the five extracted second nozzles 230 and the ten extracted third nozzles 240 into a third pack 330. The controller 160 may utilize the second nozzles 230 and third nozzles 240 constituting the third pack 330 to perform pixel printing to provide a pixel with a volume of 100 pl at one drop. FIG. 6 is a diagram illustrating the third example method of composing a pack by mixing nozzles by drop size.

Figure 7:
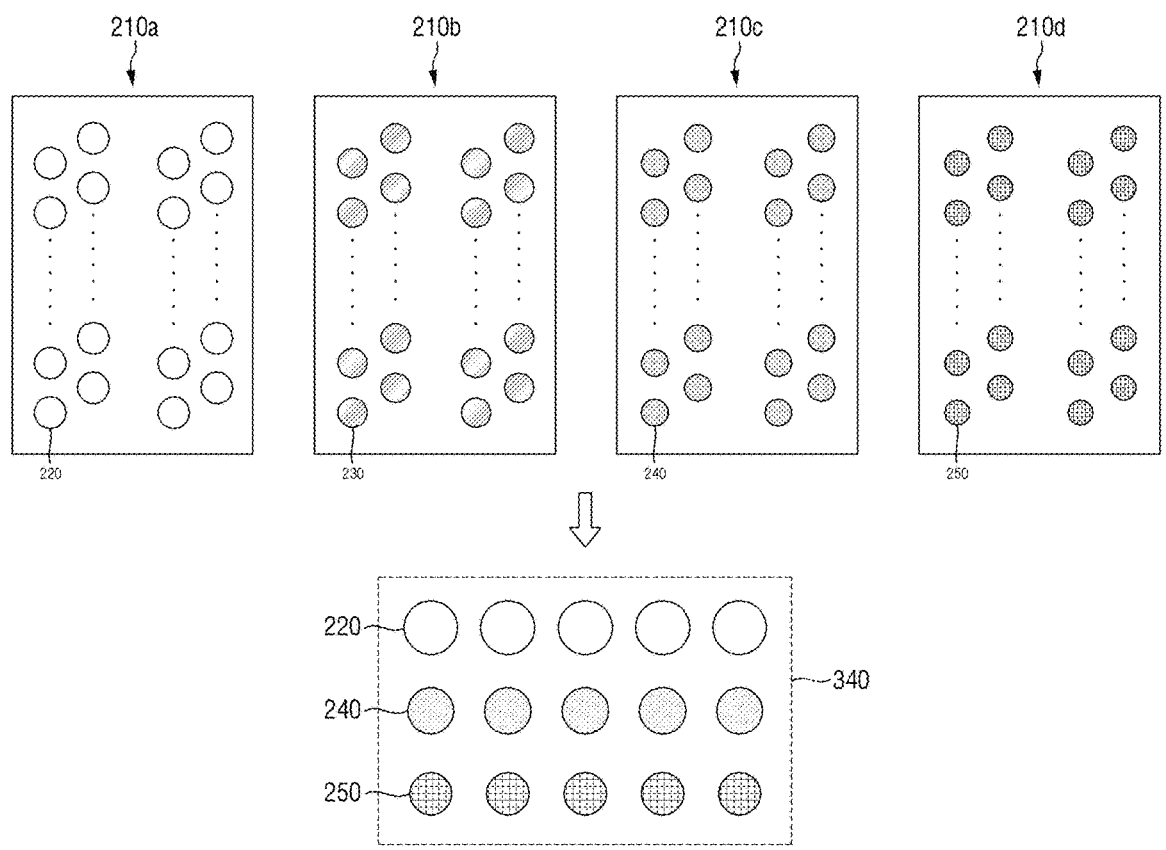
FIG. 7 is a diagram illustrating a fourth example method of composing a pack by mixing nozzles by drop size.

Next, with reference to FIG. 7, the latter case will be described, wherein one pack is composed by including at least one each of three types of nozzles having different drop sizes.

In this case, the controller 160 extracts five first nozzles 220 from the first inkjet head 210$a$, five third nozzles 240 from the third inkjet head 210$c$, and five fourth nozzles 250 from the fourth inkjet head 210$d$, and thereby compose the five extracted first nozzles 220, five extracted third nozzles 240, and five extracted fourth nozzles 250 into a fourth pack 340. The controller 160 may utilize the first nozzles 220, third nozzles 240, and fourth nozzles 250 constituting the fourth pack 340 to perform pixel printing to provide a pixel with a volume of 100 pl at one drop. FIG. 7 is a diagram illustrating the fourth example method of composing a pack by mixing nozzles by drop size.

The above has described a method of composing different sized dropping nozzles into one pack with reference to FIGS. 2 to 7. The controller 160 may not only compose a nozzle pack by extracting different sized dropping nozzles from a single inkjet head but also compose a nozzle pack by extracting different sized dropping nozzles from a plurality of inkjet heads.

When the substrate processing apparatus 100 discharges droplets on the substrate G to perform the pixel printing on the substrate G, the controller 160 may generate a mixed composition of two or more types of nozzles with different drop sizes according to the desired volume of the pixel, and thereby compose a single pack.

Figure 8:
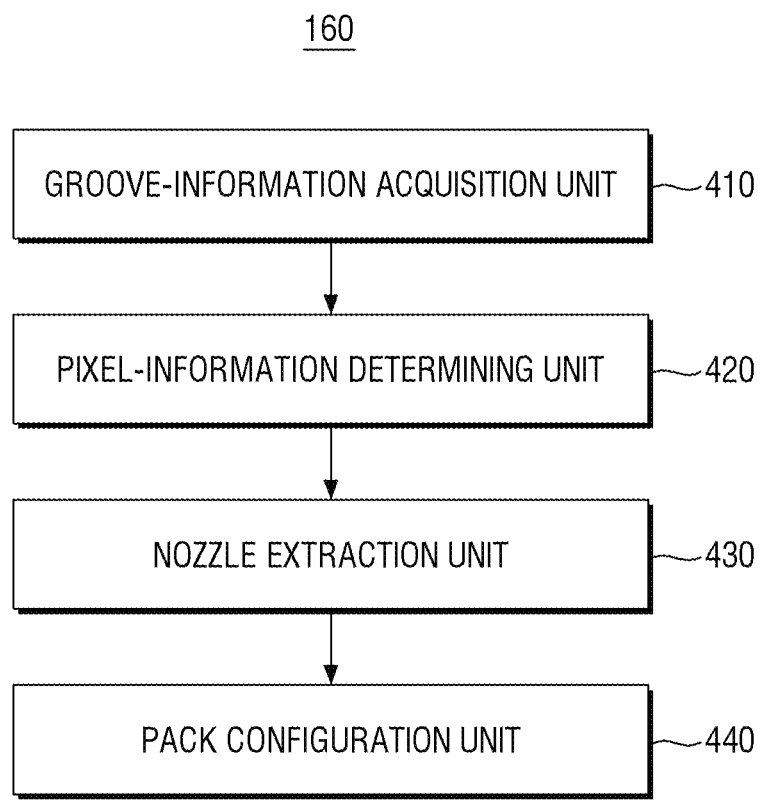
FIG. 8 is a schematic block diagram illustrating the internal modules of a controller constituting a substrate processing apparatus according to at least one embodiment of the present disclosure.

In this case, the controller 160 may be configured to compose a single pack according to the desired volume of the pixel by including a groove-information acquisition unit 410, a pixel-information determining unit 420, and a nozzle extraction unit 430, and a pack configuration unit 440, as shown in FIG. 8. FIG. 8 is a schematic block diagram illustrating the internal modules of the controller 160 constituting a substrate processing apparatus according to at least one embodiment of the present disclosure.

The groove-information acquisition unit 410 may obtain information on the grooves formed on the substrate G. Through a photo-lithography process, the substrate G may be formed with grooves in units of pixels. The substrate processing apparatus 100 may perform pixel printing on the substrate G by discharging droplets into the grooves on the substrate G.

Provided as an input means, the groove-information acquisition unit 410 may receive, from a manager or administrator, information on the grooves formed on the substrate G. However, the embodiments of the present disclosure are not limited thereto. The groove-information acquisition unit 410 may be provided as a communication means for receiving information on the grooves formed on the substrate G by wire or wirelessly. Further, the groove-information acquisition unit 410 may be interlocked with the vision module 125 of the substrate processing apparatus 100 to generate, from image information obtained by the vision module 125 photographing the substrate G, information about the grooves formed on the substrate G.

At the same time, the groove-information acquisition unit 410 may obtain the diameter (or radius) of each groove, the depth of the groove, etc. as information on the grooves formed on the substrate G.

The pixel-information determining unit 420 may determine information on pixels to be formed in each groove based on the information on the grooves formed on the substrate G, which is obtained by the groove-information acquisition unit 410. In particular, the pixel information determiner 420 may determine the volumes of pixels to be formed in each groove.

The nozzle extraction unit 430 may use the determined volumes of pixels to be formed in each of the grooves on the substrate G from the pixel-information determining unit 420 as a basis for extracting nozzles to participate in discharging droplets into each of the grooves.

To extract the nozzles to participate in ejecting droplets into each groove, the nozzle extraction unit 430 may obtain information on the drop sizes of the nozzles provided in the inkjet head. Upon obtaining the information on the nozzles' drop sizes, the nozzle extraction unit 430 may use this information as a basis for extracting the nozzles to participate in discharging droplets into each groove.

For example, where the inkjet head has different sized dropping nozzles including small sized dropping or small-type nozzles, medium sized dropping or medium-type nozzles, and large sized dropping or large-type nozzles, etc., the nozzle extraction unit 430 may obtain information on the drop sizes of these nozzles, and then extract, based on this information, the nozzles to participate in discharging droplets to each groove.

When extracting the nozzles to participate in discharging droplets into each groove, the nozzle extraction unit 430 may determine a drop size and then extract the nozzles to participate in discharging droplets into each groove.

For example, when the pixel volume is 100 pl with the inkjet head including nozzles having a drop size of 6 pl, nozzles having a drop size of 13 pl, and nozzles having a drop size of 25 pl, etc., the nozzle extraction unit 430 may determine all types of nozzles with different drop sizes and then extract, as the nozzles to join to fill the pixel volume 100 pl, four nozzles with drop size 6 pl, two nozzles with drop size 13 pl, and two nozzles with drop size 25 pl among other combinations.

Alternatively, upon determining to use some types of nozzles with different drop sizes, the nozzle extraction unit 430 may extract eight nozzles with drop size 6 µl and four nozzles with drop size 13 pl among other combinations, as the nozzles to join to fill the pixel volume 100 pl.

On the other hand, when extracting nozzles to participate in discharging droplets into each groove, the nozzle extraction unit 430 may determine the number of nozzles and then extract nozzles to participate in discharging droplets into each groove.

For example, when the pixel volume is 100 pl with the inkjet head including nozzles with drop size 6 pl, nozzles with drop size 13 pl, and nozzles with drop size 25 pl, the nozzle extraction unit 430 may determine the number of nozzles to be 8 to participate in discharging droplets into each groove. In this case, as participating nozzles to fill the pixel volume 100 pl, the nozzle extraction unit 430 may extract four nozzles with drop size 6 pl, two nozzles with drop size 13 pl, and two nozzles with drop size 25 pl.

Additionally, the nozzle extraction unit 430 may determine the number of nozzles to be 12 to participate in discharging droplets into each groove. In this case, as participating nozzles to fill the pixel volume 100 pl, the nozzle extraction unit 430 may extract eight nozzles with drop size 6 µl and four nozzles with drop size 13 pl among other combinations of nozzles.

On the other hand, there may be cases where the volume of the pixel cannot be accurately filled with the nozzles provided in the inkjet head. For example, when an inkjet head has nozzles with drop size 6 pl, nozzles with drop size 13 pl, and nozzles with drop size 30 pl, etc., and pixel volume 105 pl is there to fill, it cannot be filled accurately with the nozzles having the drop sizes as specified above.

Therefore, in this case, the present disclosure may extract the participating nozzles to overfill or exceed the reference value (i.e., 105 pl) but provide the smallest error from the reference value up to, e.g., 106 pl. For example, as participating nozzles to discharge a total droplet of 106 pl, the nozzle extraction unit 430 may extract four nozzles with drop size 6 pl, four nozzles with drop size 13 pl, and one nozzle with drop size 30 pl.

Alternatively, the nozzle extraction unit 430 may extract nine nozzles with drop size 6 μl and four nozzles with drop size 13 pl among other combinations as the participating nozzles.

With the participating nozzles extracted by the nozzle extraction unit 430, the pack configuration unit 440 may compose the participating nozzles as a single pack. The multiple nozzles composed into the single pack may discharge droplets into the same groove on the substrate G.

Figure 9:
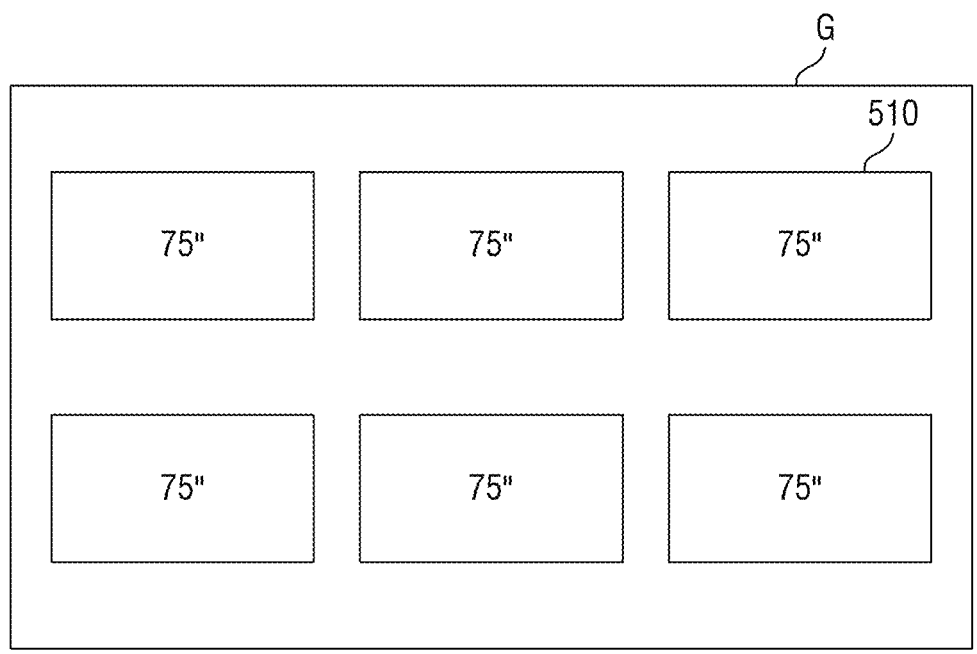
FIG. 9 is a diagram illustrating various first example functions of a controller constituting a substrate processing apparatus according to at least one embodiment of the present disclosure.

Meanwhile, a plurality of grooves having the same size may be formed on the substrate G, but a plurality of grooves having different sizes may also be formed on the substrate G. For example, the substrate G may be formed, as shown in FIG. 9, with six first cell regions 510 to be used for manufacturing six 75-inch display devices. In this case, since a plurality of grooves having the same size will be formed on the substrate G, the controller 160 may compose the unit pack by extracting a plurality of nozzles having different drop sizes according to the method described with reference to FIG. 8.

Figure 10:
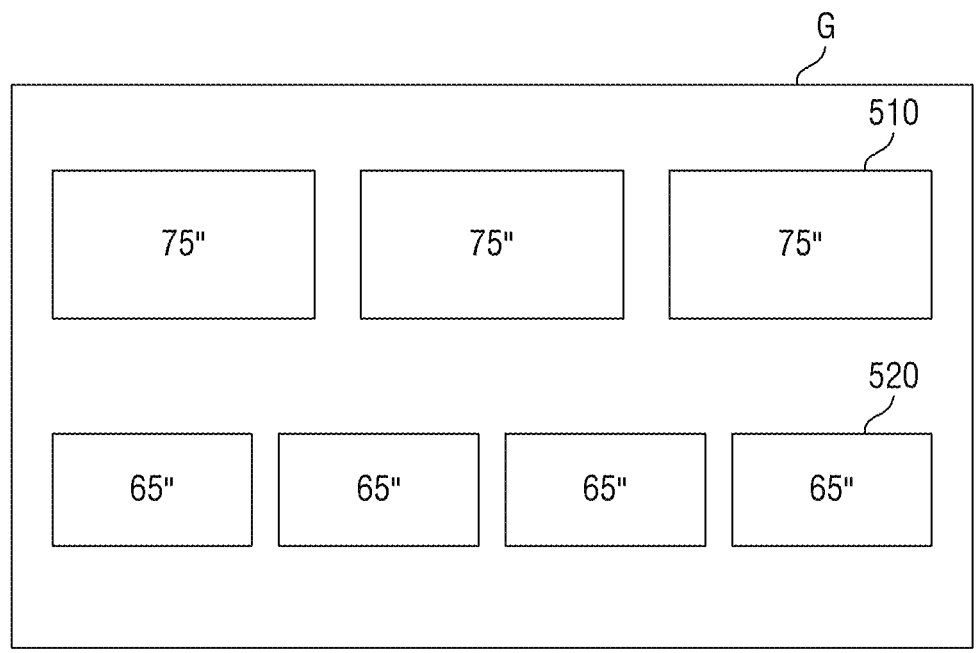
FIG. 10 is a diagram illustrating various second example functions of a controller constituting a substrate processing apparatus according to at least one embodiment of the present disclosure.

On the other hand, the substrate G may be formed, as shown in FIG. 10, with three first cell regions 510 to be used for manufacturing three 75-inch display devices and four second cell regions 510 to be used for manufacturing four 65-inch display devices. This configuration would render the substrate G to be formed with grooves having a first size in the first cell regions 510 and grooves having a second size smaller than the first size in the second cell regions 520, respectively. So the controller 160 may compose the unit pack according to the following method.

First, the controller 160 may compose a unit pack in relation to the grooves of either the first size or the second size among the grooves of the two different sizes by extracting the different sized dropping nozzles according to the method described with reference to FIG. 8. Thereafter, the controller 160 may compose another pack in relation to the grooves of the remaining one of the first size and the second size by extracting the different sized dropping nozzles according to the method described with reference to FIG. 8.

Second, the controller 160 may compose a nozzle pack by simultaneously extracting the different sized dropping nozzles in relation to the respective ones of the grooves of the first size and the grooves of the second size. FIG. 9 is a diagram illustrating the various first example functions of a controller constituting a substrate processing apparatus according to at least one embodiment of the present disclosure, and FIG. 10 is a diagram illustrating the various second example functions of a controller constituting a substrate processing apparatus according to at least one embodiment of the present disclosure.

For example, there may be two scenarios assuming a single pixel with drop volumes of 100 μl and 190.3 pl each, where small- (S-)type heads are provided with drop size 6 μl and medium- (M-)type heads are provided with drop size 13 pl. With the mixed composition of the nozzles into unit packs according to the present disclosure, the total number of drops is reduced to improve the swath condition, while reducing the error rate as compared to the target volume. The following describes this issue with an illustrative example.

Into a conventional pack, five S-type heads might be composed. On the other hand, in the pack according to the present disclosure, the S-type nozzles and the M-type nozzles can be composed in the form of SMSMS or MSMSM. The volumes of nozzle's single drops of the respective heads are represented by S=6 pl, M=13 pl for use as a basis.

FIG. 11 is a diagram illustrating a first example case of matching the target volume of 100 pl, and FIG. 12 is a diagram illustrating a second example case of matching the target volume of 100 pl.

According to FIG. 11, when composing small heads, 96 pl is achieved at 16-drop and 102 pl is achieved at 17-drop. Therefore, 96 pl at 16 drops causes an error of 4% relative to the target volume, and 102 pl at 17-drop causes an error of 2% compared to the target volume.

On the other hand, according to FIG. 12, when composing small+medium heads, 100 pl is achieved at 12-drop. Therefore, an error of 0% occurs compared to the target volume, and the pack configuration according to the present disclosure effects accurate matching with the target volume.

FIG. 13 is a diagram illustrating a first example case of matching the target volume of 190.3 pl, and FIG. 14 is a diagram illustrating a second example case of matching the target volume of 190.3 pl.

According to FIG. 13, when composing small heads, 192 pl is achieved at 32-drop. Therefore, an error of 0.885% occurs compared to the target volume.

On the other hand, according to FIG. 14, when composing small+medium heads, 190 pl is achieved at 20-drop. Therefore, an error of 0.157% occurs compared to the target volume, and the pack configuration according to the present disclosure can not only reduce the number of drops and, in turn, the number of scans but also provide the effect of reducing the error compared to the target volume.

The present disclosure relates to a method of controlling an inkjet head, and more particularly, to a printing method that composes different sized dropping nozzles or nozzles from different heads into a unit pack.

The present disclosure represents a printing method capable of nozzle & volume mixing when composing N inkjet heads, through composing a nozzle pack with two and three types of heads of different volumes that share the common jetting signal characteristics when N inkjet heads are composed. The present disclosure offers a solution to fine drop controlling over a printing function with multiple heads composed as a pack, wherein the heads composed are of different volumes rather than of a uniform model. The resultant nozzle composition can reduce the scans (swaths) of printing, leading to improved productivity.

While a few exemplary embodiments of the present disclosure have been described with reference to the accompanying drawings, those skilled in the art will readily appreciate that various changes in form and details may be made therein without departing from the technical idea and scope of the present disclosure as defined by the following claims. Therefore, it is to be understood that the foregoing is illustrative of the present disclosure in all respects and is not to be construed as limited to the specific exemplary embodiments disclosed.

The invention claimed is:

1. A method of treating a substrate, the method comprising:
    selecting nozzles for discharging substrate treatment solution to one pixel among different sized dropping nozzles having different drop sizes; and
    performing pixel printing on the substrate with the nozzles selected among the different sized dropping nozzles by discharging the substrate treatment solution to a common target location for the one pixel on the substrate,
    wherein the selecting of the nozzles comprises:
    determining whether the nozzles for discharging the substrate treatment solution to the one pixel are able or unable to be selected such that a total volume of the substrate treatment solution discharged to the one pixel from the nozzles selected among the different sized dropping nozzles is identical to a volume required for the one pixel,
    if the nozzles for discharging the substrate treatment solution to the one pixel are able to be selected such that the total volume of the substrate treatment solution discharged to the one pixel from the nozzles selected among the different sized dropping nozzles is identical to the volume required for the one pixel, selecting the nozzles for discharging the substrate treatment solution to the one pixel among the different sized dropping nozzles such that the total volume of the substrate treatment solution discharged to the one pixel from the nozzles selected among the different sized dropping nozzles is identical to the volume required for the one pixel, and
    if the nozzles for discharging the substrate treatment solution to the one pixel are unable to be selected such that the total volume of the substrate treatment solution discharged to the one pixel from the nozzles selected among the different sized dropping nozzles is identical to the volume required for the one pixel, selecting the nozzles for discharging the substrate treatment solution to the one pixel among the different sized dropping nozzles such that the total volume of the substrate treatment solution discharged to the one pixel from the nozzles selected among the different sized dropping nozzles is greater than the volume required for the one pixel and has a lowest difference between the volume required for the one pixel and the total volume of the substrate treatment solution discharged to the one pixel from the nozzles selected among the different sized dropping nozzles.

2. The method of claim 1, wherein the selecting of the nozzles comprises:
    selecting one or more of the different sized dropping nozzles each based on the volume required for the one pixel.

3. The method of claim 1, wherein the selecting of the nozzles comprises:
    selecting a plurality of drop sizes and then selecting the nozzles that are related to respective drop sizes, or determining a selected number of nozzles and then selecting the different sized dropping nozzles based on the selected number.

4. The method of claim 1, wherein the selecting of the nozzles comprises:
    selecting the nozzles among the different sized dropping nozzles located at a single head, or selecting the nozzles among the different sized dropping nozzles located at a plurality of heads.

5. The method of claim 4, wherein the selecting of the nozzles is performed with the single head including the different sized dropping nozzles.

6. The method of claim 4, wherein the selecting of the nozzles among the different sized dropping nozzles located at the plurality of heads is performed with a plurality of equal sized dropping nozzles included in each of the heads and with different sized dropping nozzles included in different ones of the heads.

7. The method of claim 1, further comprising:
    obtaining information on grooves that are formed on the substrate; and
    determining the volume required for the one pixel formed in each of the grooves based on the information on the grooves.

8. The method of claim 7, wherein the obtaining of information on the grooves comprises:
    obtaining information on the grooves based on an image obtained by photographing the substrate.

9. The method of claim 7, wherein the information on the grooves comprises:
    a diameter of each groove and a depth of each groove.

10. The method of claim 1, wherein the selecting of the nozzles comprises:
    analyzing drop sizes of nozzles included in an inkjet head and selecting the nozzles among the different sized dropping nozzles by the analyzing of the drop sizes of the nozzles included in the inkjet head.

11. The method of claim 10, further comprising:
    determining whether the substrate treatment solution is available or unavailable to be discharged by an amount corresponding to the volume required for the one pixel.

12. The method of claim 7, wherein the obtaining of information on the grooves is performed when individually forming cell regions for manufacturing display devices having different sizes and comprises:
    obtaining information on the grooves in relation to each of the cell regions.

13. A method of treating a substrate, the method comprising:
    obtaining information on grooves formed on the substrate;
    determining a pixel volume required for one pixel formed in each of the grooves based on the information on the grooves;
    selecting nozzles for discharging a substrate treatment solution to the one pixel among different sized dropping nozzles having different drop sizes based on the volume required for the one pixel; and
    performing pixel printing on the substrate with the nozzles selected among the different sized dropping nozzles by discharging the substrate treatment solution to a common target location for the one pixel on the substrate,
    wherein the selecting of the nozzles comprises:
    analyzing drop sizes of the nozzles included in an inkjet head,
    determining whether the nozzles for discharging the substrate treatment solution to the one pixel are able or unable to be selected such that a total volume of the substrate treatment solution discharged to the one pixel from the nozzles selected among the different sized dropping nozzles is identical to the volume required for the one pixel,
    if the nozzles for discharging the substrate treatment solution to the one pixel are able to be selected such that the total volume of the substrate treatment solution discharged to the one pixel from the nozzles selected among the different sized dropping nozzles is identical to the volume required for the one pixel, selecting the nozzles for discharging the substrate treatment solution to the one pixel among the different sized dropping nozzles such that the total volume of the substrate treatment solution discharged to the one pixel from the nozzles selected among the different sized dropping nozzles is identical to the volume required for the one pixel, and if the nozzles for discharging substrate treatment solution to the one pixel are unable to be selected such that the total volume of the substrate treatment solution discharged to the one pixel from the nozzles selected among the different sized dropping nozzles is identical to the volume required for the one pixel, selecting the nozzles for discharging substrate treatment solution to the one pixel among the different sized dropping nozzles such that the total volume of the substrate treatment solution discharged to the one pixel from the nozzles selected among the different sized dropping nozzles is greater than the volume required for the one pixel and has a lowest difference between the volume required for the one pixel and the total volume of the substrate treatment solution discharged to the one pixel from the nozzles selected among the different sized dropping nozzles.

* * * * *